United States Patent [19]
Inoi

[11] Patent Number: 5,523,645
[45] Date of Patent: Jun. 4, 1996

[54] ELECTROSTRICTIVE EFFECT ELEMENT AND METHODS OF PRODUCING THE SAME

[75] Inventor: Takayuki Inoi, Tokyo, Japan

[73] Assignee: NEC Corporation, Japan

[21] Appl. No.: 351,549

[22] Filed: Dec. 7, 1994

Related U.S. Application Data

[63] Continuation of Ser. No. 207,806, Mar. 8, 1994, abandoned, which is a continuation of Ser. No. 880,222, May 8, 1992, abandoned.

[30] Foreign Application Priority Data

May 9, 1991 [JP] Japan .................................... 3-102941

[51] Int. Cl.⁶ .................................................. H01L 41/08
[52] U.S. Cl. ......................... 310/364; 310/328; 310/363; 310/366
[58] Field of Search ............................ 310/328, 363–366

[56] References Cited

U.S. PATENT DOCUMENTS 4,803,763  2/1989  Eturo et al. .............................. 310/328

FOREIGN PATENT DOCUMENTS 0211974  9/1987  Japan ..................................... 310/366

Primary Examiner—Mark O. Budd
Attorney, Agent, or Firm—Laff, Whitesel, Conte & Saret, Ltd.

[57] ABSTRACT

An electrostrictive effect element has a laminated-structure formed by a plurality of electrostrictive ceramic members and a plurality of internal electrode conductive layers which are stacked alternatingly. The electrostrictive effect element has, on each of the opposite side surfaces of the laminated-structure, an external electrode conductive layer which is formed by a plurality of land conductors made of sintered-type conductive paste for interconnecting the exposed internal electrode conductive layers not covered by glass insulation layers, and a belt-like conductor made of resin hardening-type conductive paste for interconnecting the plurality of land conductors. Silver diffusion into the glass insulation layers can be avoided while maintaining low contact resistance between the external electrode conductive layer and the internal electrode conductive layers. A reliable electrostrictive effect element with excellent electrical characteristics, which does not suffer from any insulation deterioration to be caused by diffusion of silver into the glass insulation layers and which can be used satisfactorily in pulse-signal used applications is realized.

9 Claims, 3 Drawing Sheets

ELECTROSTRICTIVE EFFECT ELEMENT AND METHODS OF PRODUCING THE SAME

This application is a continuation of application Ser. No. 08/207,806, filed Mar. 8, 1994, now abandoned, which was a continuation of Ser. No. 07/880,222, filed May 8, 1992, now abandoned.

BACKGROUND OF THE INVENTION

(1) Field of the Invention

The present invention relates to an electrostrictive effect element and, more particularly, to a laminated-type electrostrictive effect element and a method of producing the same.

(2) Description of the Related Art

An example of a typical conventional electrostrictive effect element to which the present invention relates is shown in FIG. 1. As shown therein, the electrostrictive effect element has a laminated or stacked structure in which a plurality of internal electrode conductive layers 1 made of silver-palladium alloy and a plurality of electrostrictive ceramic members 2 superimposed alternatingly are formed. A plurality of glass insulation layers 3 are formed on the exposed end surfaces of every other internal electrode conductive layer on the two opposite sides of the laminated structure. An external electrode conductive layer 4 having a strip or belt-like shape and made of sintered-type silver paste is formed on each of the two opposite sides of the laminated structure so as to interconnect the internal electrode conductive layers 1. A pair of lead wires 5 are soldered to the external electrode conductive layers 4. The feature of this electrostrictive effect element resides in the provision of the glass insulation layers 3.

Another structure of such type electrostrictive effect element is one in which the external electrode conductive layer 4 is improved from the above described sintered-type to hardened-type in order to relieve the stress and prevent silver diffusion to the glass insulation layer during the sintering process of the external electrode conductive layer.

Moreover, there is a further conventional electrostrictive effect element as shown in FIG. 2 which is an improvement over the ones shown in FIG. 1. In such electrostrictive effect element, the insulation glass layers 3 as shown in FIG. 1 do not exist. In other words, in this electrostrictive effect element, a plurality of land conductors 6 are formed on, and electrically connected to the end surfaces of every other internal electrode conductive layer 1 exposed on both sides of the laminated structure, followed by welding of a connection wire 7 by means of wire bonding to each of the land conductors 6 for them to be electrically connected on the respective sides, and by soldering thereto a lead wire 5. It should be noted that, in the configuration of FIG. 2, the glass insulation layer 3 as shown in FIG. 1 can be omitted.

In the first of the above explained three conventional electrostrictive effect elements, the external electrode conductive layer 4 is formed by the printing and sintering of a silver-based conductive paste. In this case, the silver will diffuse into the glass insulation layer 3, during the sintering of the conductive paste, since the sintering temperature of the conductive paste (about 600° C.) is close to the sintering temperature of the glass (about 620° C.) used as the glass insulation layer 3. Therefore, the electrical insulation characteristics of the glass insulation layer 3 have a tendency to deteriorate in this type of electrostrictive effect element. This phenomenon is significant especially in highly humid atmosphere and will cause insulation failure during usage in extreme conditions.

The conventional electrostrictive effect element of the second type eliminates the above mentioned disadvantage by making use of a hardening-type conductive paste (hardening temperature: room temperature–150° C.) instead of the sintered-type conductive paste as the material for the external electrode conductive layer, whereby it is possible to prevent the silver diffusion into the glass insulation layer by lowering the formation temperature of the external electrode conductive layer 4. In this electrostrictive effect element, the aspect of insulation deterioration phenomenon of the glass insulation layer 3 attributable to silver diffusion may definitely be improved. However, with the hardening-type conductive paste, the resistance is high as compared with that in the sintered-type due to its structure wherein metal particles are not like in a dispersed state within the resin. Thus, in order to have it connected to the internal electrode conductive layer 1, with sufficiently a low resistance, the contact surface with the internal electrode conductive layer 1 must be made fairly large. In the case of an electrostrictive effect element of a laminated-type, the thickness of the internal electrode conductive layer 1 connected with the external electrode conductive layer 4 is less than 10 μm which is very thin. Therefore, the dielectric dissipation factor (tan δ), as the element characteristic, will increase as the contact resistance between the external electrode conductive layer 4 and the internal electrode conductive layer 1 become large in the second type conventional electrostrictive effect element where a hardening-type conductive paste is used for the external electrode conductive layer 4. As a result, it will be disadvantageous in pulse signal used applications since the displacement response speed will become slower than that in the first type where the sintered-type conductive paste is used.

Further, in the third type conventional electrostrictive effective element, in order to make an improvement over the first type electrostrictive effect element, the land conductors are used and are interconnected by the connection wires 7 thereby eliminating the need of the glass insulation layer 3. However, with this configuration, the wire 7 will break from fatigue or stress when subjected to repeated drive since a force in the direction of bending will act upon the wire 7 when the element is driven. Also, problems such as short circuiting or breaking of the wire 7 may occur as the wire 7 which is bent can easily come in contact with an opposing electrode or the wire 7 may get caught when it is in a naked state thereby exposing itself from the surface of the element.

SUMMARY OF THE INVENTION

It is, therefore, an object of the invention to overcome the problems existing in the conventional elements and to provide an improved electrostrictive effect element.

According to one aspect of the invention, there is provided an electrostrictive effect element comprising:

a laminated structure having a plurality of electrostrictive ceramic members and a plurality of internal electrode conductive layers superimposed alternatingly;

a plurality of insulation layers which insulate every other exposed portion of the internal electrode conductive layers at two opposite side surfaces of the laminated structure; and a pair of external electrode conductive layers each of which is provided on each of the side surfaces of the laminated structure and each of which electrically interconnects the exposed portions of the internal electrode conductive layers so that the internal electrode conductive layers adjacent to each other form opposite polarity electrodes, the external electrode conductive layer having first conductive members and second conductive members, each of the first conductive members being provided at each of the side surfaces on which the insulation layers are formed and covering each of the exposed portions of the internal electrode conductive layers but not being in contact with the insulation layers, and each of the second conductive members being provided at each of the side surfaces on which the insulation layers and the first conductive members are formed and electrically interconnecting the first conductive members.

According to another aspect of the invention, there is provided a method of producing an electrostrictive effect element, the method comprising the steps of:

forming a laminated structure having a plurality of electrostrictive ceramic members and a plurality of internal electrode conductive layers superimposed alternatingly;

forming a plurality of insulation layers which insulate every other exposed portion of the internal electrode conductive layers at two opposite side surfaces of the laminated structure; and forming a pair of external electrode conductive layers each of which is provided on each of the side surfaces of the laminated structure and each of which electrically interconnects the exposed portions of the internal electrode conductive layers so that the internal electrode conductive layers adjacent to each other form opposite polarity electrodes;

the step of forming the external electrode conductive layer having steps of forming first conductive members and second conductive members, each of the first conductive members being formed at each of the side surfaces on which the insulation layers are formed so as to cover each of the exposed portion of the external electrode conductive layers but not to be in contact with the insulation layers, and each of the second conductive members being formed at each of the side surfaces on which the insulation layers and the first conductive members are formed thereby electrically interconnecting the first conductive members.

BRIEF DESCRIPTION OF THE DRAWINGS

The above and other objects, features and advantages of the present invention will be apparent from the following description of preferred embodiments of the invention, with reference to the accompanying drawings, in which.

PREFERRED EMBODIMENTS OF THE INVENTION

Figure 1:
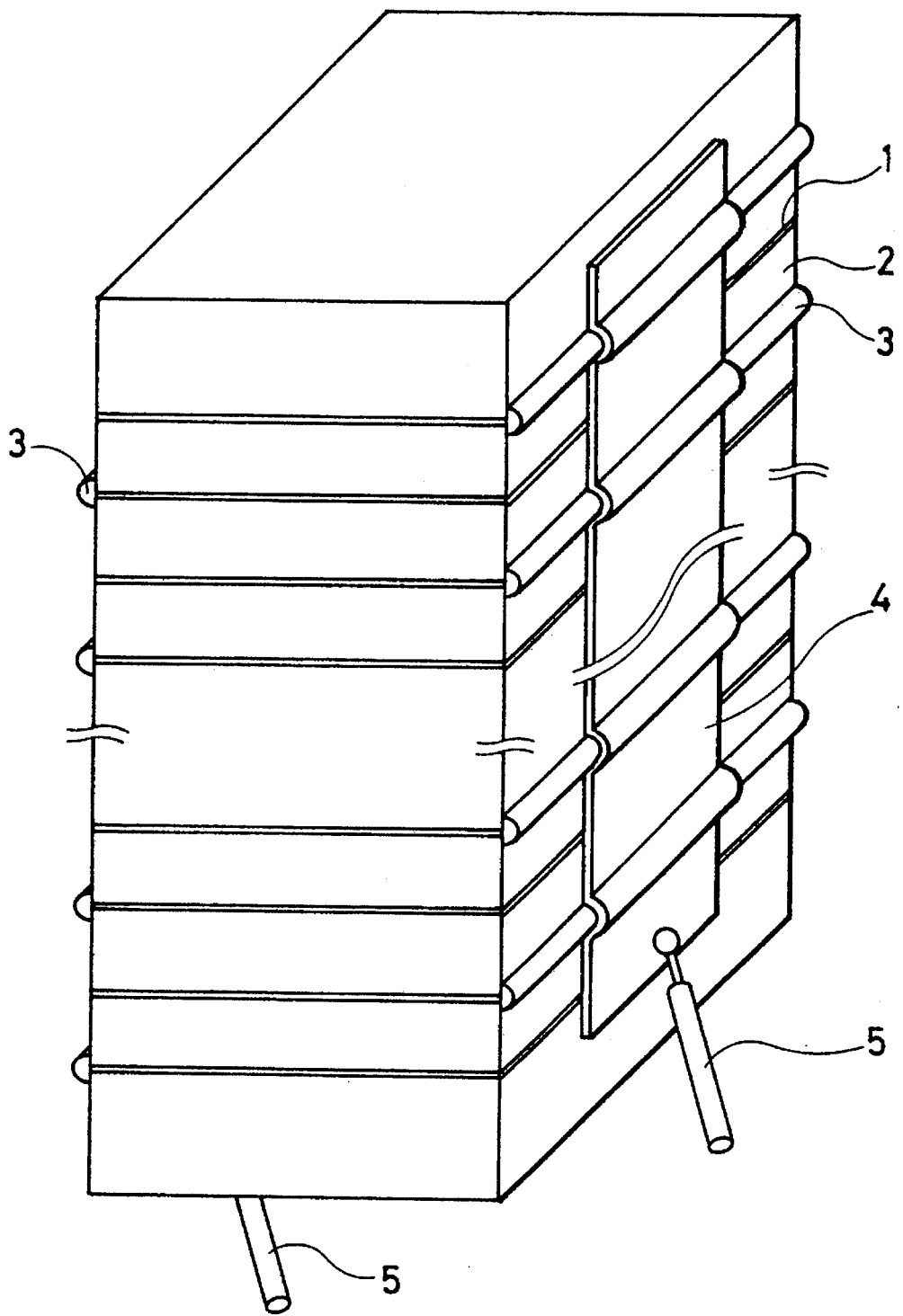
FIG. 1 is a perspective view showing each of the structures of the first and second examples of the conventional electrostrictive effect element.
Figure 2:
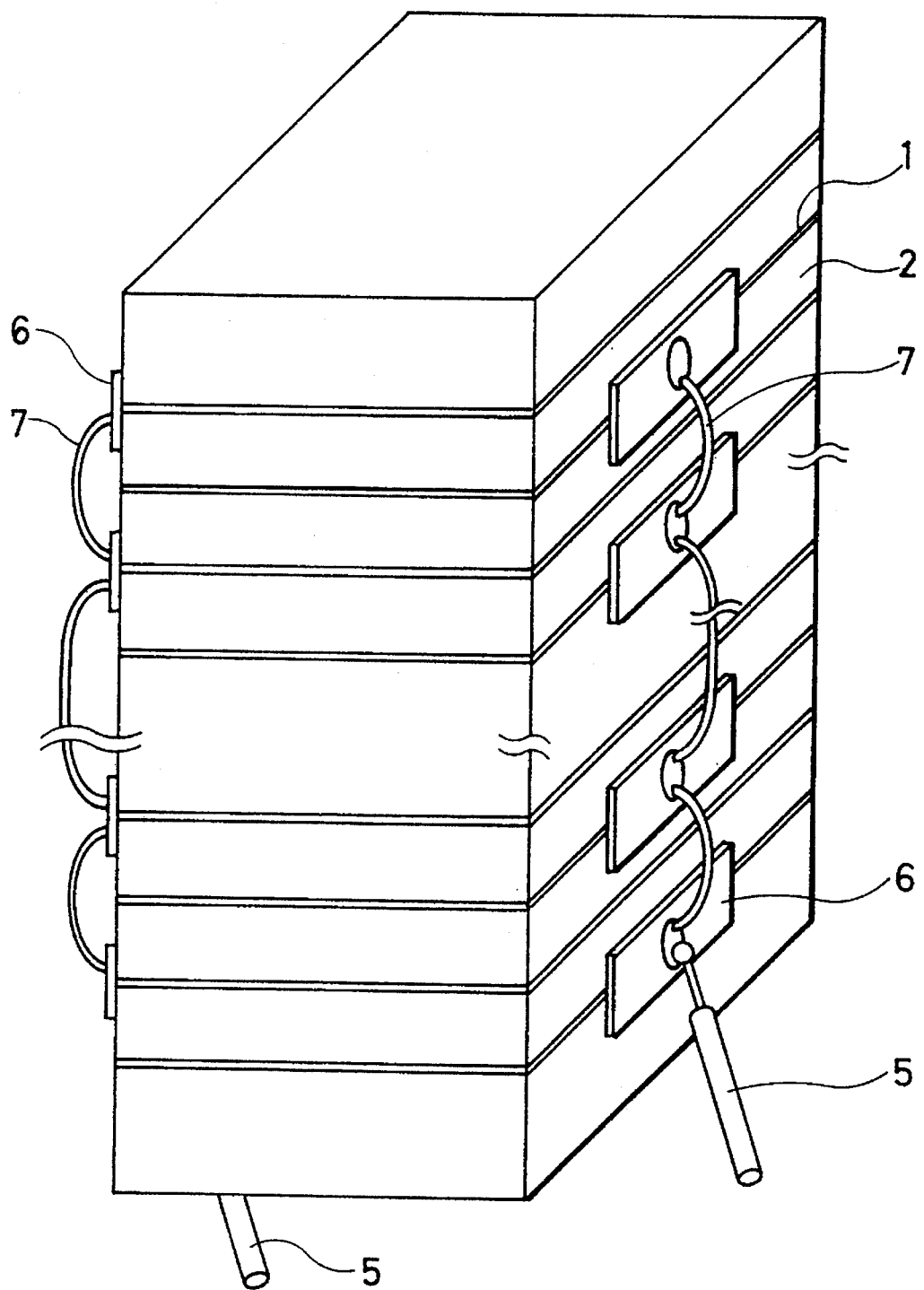
FIG. 2 is a perspective view showing the structure of the third example of the conventional electrostrictive effect element.

Now, preferred embodiments of the invention will be explained with reference to the accompanying drawings. The same reference numerals used in FIGS. 1 and 2 are also used in FIG. 3 for the same or like elements.

Figure 3:
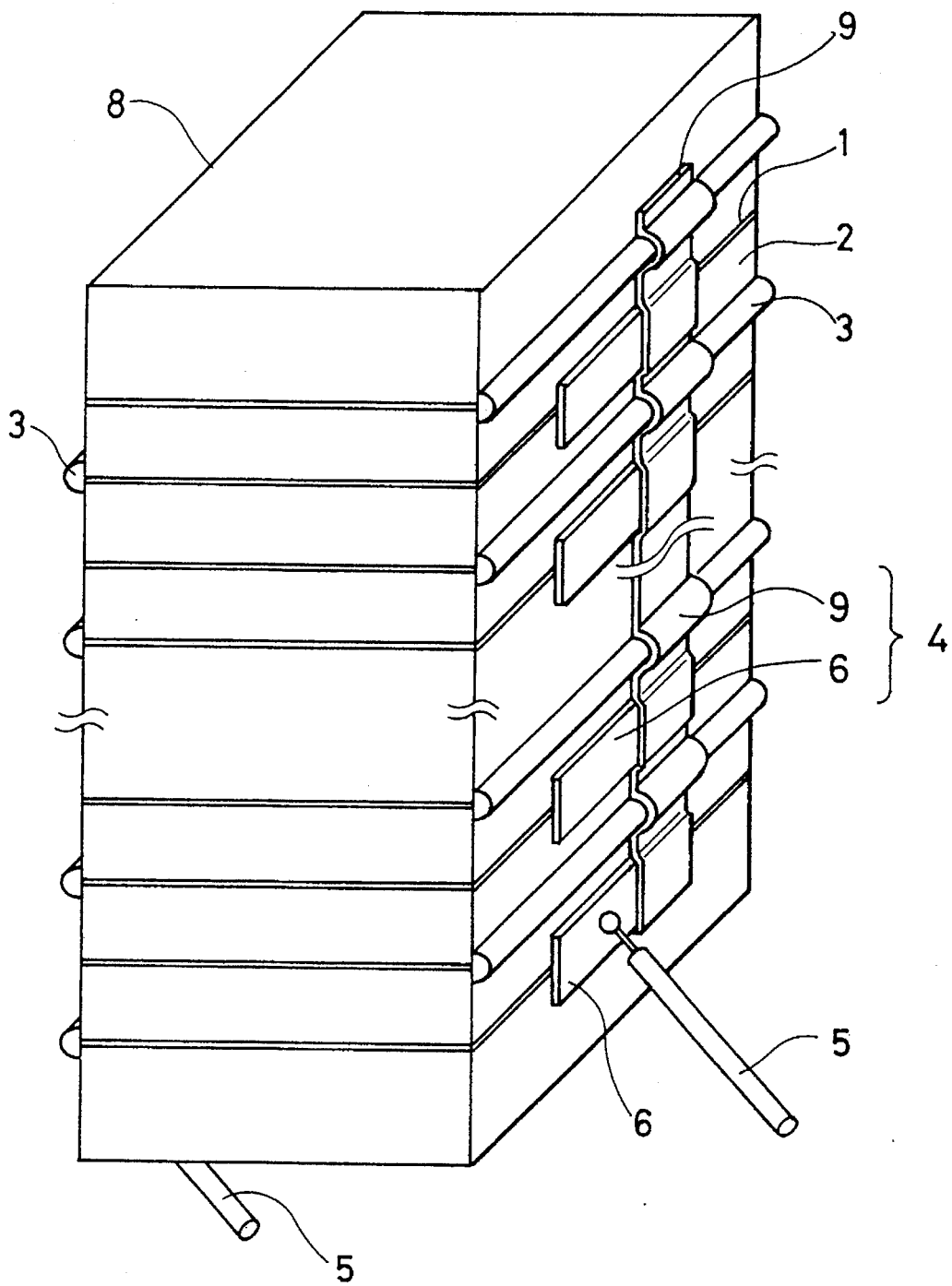
FIG. 3 is a perspective view showing each of the structures of the first and second embodiments of the electrostrictive effect element according to the present invention.

FIG. 3 is a perspective view of a first embodiment of the electrostrictive effect element according to the invention.

The electrostrictive effect element 8 of this invention has a laminated structure formed by a plurality of electrostrictive ceramic members 2 and a plurality of internal electrode conductive layers 1 of silver-palladium alloy which are superimposed alternatingly; a plurality of glass insulation layers 3 which are formed alternatingly between one and the other end surfaces (right and left on the drawings) of the silver-palladium internal electrode conductive layers 1; a plurality of land conductors 6 each of which is formed on each edge of the internal electrode conductive layers 1 which are not insulated with the glass insulators, in such a way that the land conductors 6 do not touch the adjacent glass insulators 3, on the side surfaces on which the glass insulators 3 are formed; a pair of conductive belt-like strips 9 formed on the side surface on which the land conductors 6 are formed for electrically interconnecting the land conductors 6; and a pair of lead wires 5 electrically connected to the land conductors 6.

A description will be made hereunder of an embodiment of the invention for a method of producing the electrostrictive effect element 8.

The laminated structure is formed by preparing a green ceramic sheet which is made by mixing a perovskite crystalline multi-component solid solution ceramic powder (e.g., $Pb(Zr,Ti)O_3$) and an organic binder powder (e.g., polyvinyl butyral resin), applying or printing the silver-palladium paste on the green ceramic sheet, and laminating this to 60~80 layers which are sintered at a high temperature (e.g., 1,000° C. or above).

Next, the glass insulation layer 3 is formed on the end surfaces of the exposed internal electrode conductive layers 1, on the opposing sides of the laminated structure, by applying and sintering the glass powder through electrophoretic process. Likewise, the glass insulation layers 3 are formed on every other opposing exposed internal electrode conductive layer 1, on the other side of the laminated structure, by applying and sintering the glass powder through the electrophoretic process.

Next, a sintered-type silver paste is printed on one of the surfaces where the glass insulation layers 3 are formed in such a way that the glass insulation layers 3 are not touched. After drying the silver paste, the silver paste is printed on the opposite surface of the laminated structure. After drying, both the sides are sintered simultaneously at a temperature of approximately 600° C. to form the land conductors 6.

Subsequently, after an epoxy resin base hardening-type conductive paste that includes silver particles is printed in a strip or belt-like shape on each of the surfaces where the land conductors 6 have been formed, the paste is hardened at a temperature of 150° C. for one hour to form the strip conductors 9. The lead wires 5 are soldered to the land conductors 6, thereby completing the electrostrictive effect element of this embodiment.

The second embodiment of this invention will now be explained hereinafter. The difference in this embodiment from the first embodiment is that, in the arrangement shown in FIG. 3, the strip conductor 9 interconnecting the land conductors 6 is made of a gold vaporized film.

In this second embodiment, the strip conductor 9 is formed by vapor-depositing a gold to form a film having a thickness of 5 μm through an ion-beam process on the land conductors 6 at one of the two opposing sides of the laminated structure. Likewise, the gold deposited strip conductor 9 is formed on the land conductors 6 at the other of two opposing sides of the laminated structure. The process is not limited to the ion-beam process explained in the second embodiment. The gold deposited film may be one formed by other types of processes such as a resistance-thermal type and an electron-beam type. Moreover, a similar effect as in this second embodiment can be obtained by use of a metallized film formed by other physical vapor phase growth methods such as a sputtering method.

As has been explained hereinabove, the electrostrictive effect element of this invention utilizes as the external electrode conductive layers the land conductors which are produced by the sintered-type conductive paste applied and sintered to form the land conductor and which interconnect the internal electrode conductive layers in such a way as not to be in contact with the glass insulation layers. The band-like or strip conductor formed under a low temperature with use of resin hardening-type conductive paste or of vapor phase deposition of a metal such as a gold is used for interconnecting the land conductors. Therefore, silver diffusion to the glass insulation layer can be avoided while a low contact resistance is maintained between the internal electrode conductive layers and the external electrode conductive layers, and it is not necessary to use the land conductor connection wires that can be easily deformed.

Therefore, according to this invention, it is possible to provide a reliable electrostrictive effect element with excellent electrical characteristics, which does not suffer from any insulation deterioration to be caused by diffusion of silver to the glass insulator and which can be used satisfactorily in pulse signal used applications.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An electrostrictive effect element comprising:

a laminated structure having a plurality of electrostrictive ceramic members with a plurality of internal electrode conductive layers alternatingly superimposed on said members;

a plurality of insulation layers which insulate every other exposed portion of said internal electrode conductive layers at two opposite side surfaces of said laminate structure; and a pair of external electrode conductive layers, each of said electrode layers being provided on each of the side surfaces of the laminated structure, each of said electrode layers being electrically interconnected to the exposed portions of said internal electrode conductive layers so that said internal electrode conductive layers adjacent to each other form opposite polarity electrodes, said external electrode conductive layer having first conductive members made of a baked-type conductive paste and second conductive members made of a resin hardening-type conductive paste, each of said first conductive members being provided at each of the side surfaces on which said insulation layers are formed and covering each of the exposed portions of said internal electrode conductive layers but not being in contact with said insulation layers, and each of said second conductive members being provided at each of the side surfaces on which said insulation layers and said first conductive members are formed and electrically interconnecting said first conductive members.

2. An electrostrictive effect element according to claim 1, in which said resin hardening-type conductive paste is taken from a group consisting of silver and silver alloy as its main constituent metal.

3. An electrostrictive effect element according to claim 1, in which said baked-type conductive paste is taken from a group consisting of silver and silver alloy as its main constituent metal.

4. An electrostrictive effect element comprising:

a laminated structure having a plurality of electrostrictive ceramic members and a plurality of internal electrode conductive layers alternatingly superimposed on said members;

a plurality of insulation layers which insulate every other exposed portion of said internal electrode conductive layers at two opposite side surfaces of said laminated structure; and a pair of external electrode conductive layers each of said electrode layers being provided on each of the side surfaces of the laminated structure, each of said electrode layers being electrically interconnected to the exposed portions of said internal electrode conductive layers so that said internal electrode conductive layers adjacent to each other form opposite polarity electrodes, said external electrode conductive layer having first conductive members made of a baked-type conductive paste and second conductive members made of a metallized film formed by a physical vapor phase growth method, each of said first conductive members being provided at each of the side surfaces on which said insulation layers are formed and covering each of the exposed portions of said internal electrode conductive layers but not being in contact with said insulation layers, and each of said second conductive members being provided at each of the side surfaces on which said insulation layers and said first conductive members are formed and electrically interconnecting said first conductive members.

5. An electrostrictive effect element according to claim 4, in which said baked-type conductive paste is taken from a group consisting of silver and silver alloy as its main constituent metal.

6. An electrostrictive effect element according to claim 4, in which said metallized film formed by a physical vapor phase growth is made of gold.

7. An electrostrictive effect element comprising:

a laminated structure having a plurality of electrostrictive ceramic members and a plurality of internal electrode conductive layers alternatingly superimposed on said members;

a plurality of insulation layers which insulate every other exposed portion of said internal electrode conductive layers at two opposite side surfaces of said laminated structure; and a pair of external electrode conductive layers each of which is provided on each of the side surfaces of the laminated structure and each of said electrode layers being electrically interconnected to the exposed portions of said internal electrode conductive layers so that said internal electrode conductive layers adjacent to each other form opposite polarity electrodes, said external electrode conductive layer having first conductive members made of a baked-type conductive paste and second conductive members made of a resin hardening-type conductive paste, each of said first conductive members being provided at each of the side surfaces on which said insulation layers are formed and covering each of the exposed portions of said internal electrode conductive layers but not being in contact with said insulation layers, each of said second conductive members being provided at each of the side surfaces on which said insulation layers and said first conductive members are formed and electrically interconnecting said first conductive members, and each of said first conductive members to which a lead wire is connected having a width greater than a width of said insulation layer.

8. An electrostrictive effect element according to claim 7, in which said resin hardening-type conductive paste is taken from a group consisting of silver and silver alloy as its main constituent metal.

9. An electrostrictive effect element according to claim 7, in which said baked-type conductive paste is taken from a group consisting of silver and silver alloy as its main constituent metal.

* * * * *